US 6,272,185 B1
Aug. 7, 2001

(54) METHOD AND APPARATUS FOR PERFORMING DATA PULSE DETECTION (75) Inventor: Anthony K. Dale Brown, Kanata (CA)

(73) Assignee: Nortel Networks Limited, Montreal (CA)

( * ) Notice: Subject to any disclaimer, the term of this patent is extended or adjusted under 35 U.S.C. 154(b) by 0 days.

(21) Appl. No.: 09/071,117

(22) Filed: May 4, 1998

(51) Int. Cl.[7] ................. H03D 1/00; H01P 5/12
(52) U.S. Cl. ............................. 375/340; 333/109
(58) Field of Search ............................ 375/340, 316, 375/318, 257, 238; 327/65; 330/252; 333/109

(56) References Cited

U.S. PATENT DOCUMENTS

| | | | |
|---|---|---|---|
| 4,222,117 | * 9/1980 | Bugg | 375/359 |
| 4,430,580 | * 2/1984 | Lovelace | 327/214 |
| 4,599,602 | * 7/1986 | Matzuzawa et al. | 341/161 |
| 4,682,343 | * 7/1987 | Pfiffner | 375/295 |
| 4,742,309 | * 5/1988 | Chu | 330/258 |
| 4,979,189 | * 12/1990 | Wile | 375/342 |
| 5,432,486 |   7/1995 | Wong | 333/109 |
| 5,852,637 | * 12/1998 | Brown et al. | 375/316 |
| 6,058,144 | * 5/2000 | Brown | 375/316 |

* cited by examiner

Primary Examiner—Chi Pham
Assistant Examiner—Khai Tran (57) ABSTRACT

The present invention relates to a data pulse receiver for receiving data signals propagating on a high speed data transmission medium, where the medium includes both data and clock channels. A hysteresis control signal is generated from the clock signal and it is used to discriminate against unwanted noise signals during the detection of data pulses conveyed by the data signal.

26 Claims, 5 Drawing Sheets

METHOD AND APPARATUS FOR PERFORMING DATA PULSE DETECTION

FIELD OF THE INVENTION

The present invention relates to signal processing, particularly in the field of asynchronous transport mode signal transmission. More specifically, it pertains to a method for compensating the substantial signal level attenuation which characterizes distributed high speed data received over a transmission medium.

BACKGROUND OF THE INVENTION

With the advent of the dawn of the Information Highway and the explosion of telecommunications, the quantity and speed of data transmission continues to grow. In the telecommunications industry, as well as in the computer industry, there exists a need to transmit large quantities of data from point to point, for example between memory and processors in multiple processor computers. The large number of data bits coupled with the large number of connections create an interconnect bottle-neck which requires large numbers of data drivers with their associated large amount of electrical power.

One way that is employed to overcome this congestion difficulty is to multiplex large numbers of parallel bit streams up to higher rate serial bit streams, thus reducing the numbers of electrical connections that need to be made. The need for low power multiplex and demultiplex circuits capable of combining data signals at, say, 50 Mb/s up to, for example, 1 Gb/s has attracted a number of commercial integrated circuit vendors. Nevertheless, the computer and communications industry continues to search for lower power solutions.

A technique that has been employed with success to reduce the number of interconnections in a communications switching equipment is to employ a method known as a contactless backplane, a technique based on directional coupling principles wherein data transfer occurs between proximate conductors. An example of one such coupling connector is described in U.S. Pat. No. 5,432,486 which issued Jul. 11, 1995 to Wong and was assigned to Northern Telecom Limited. Such a method permits point-to-multipoint and multipoint-to-point data transmission over a passive backplane without loss of signal integrity due to the multipoint connections. In this method, distribution of the multi gigabit-per-second serial data employs a form of ac coupling of such small proportions that the data information is contained in the data transitions, thus eliminating the requirement to transmit signal bandwidth below, for example, 1 GHz. In such a methodology, the received data at the demultiplex circuit is considerably attenuated Signal levels of only 70 mV peak to peak, or less, are not uncommon. Reliable reception of this data therefore requires special techniques, including signal amplification, wide frequency bandwidth, matched input impedance and some form of hysteresis to discriminate against unwanted noise signals. The resultant signal must then be restored to NRZ format.

In a co-pending Patent Application entitled "Noise Cancellation Modification to a Non-Contact Bus" by John Williamson et al., in U.S. Pat. No. 6,016,086 which issued Jan. 18, 2000 and assigned to Northern Telecom Limited, a differential microwave coupler is disclosed that achieves ac coupling of considerably attenuated signals similar to those described above. The coupler provides a canceling effect of undesirable data pulse reflections caused by vias, connectors, and other sources of controlled impedance discontinuities. This effect is provided by the configuration of the coupler's inputs, one of which is shorted to ground and the other of which is open circuited. The purpose of this open-short configuration of the inputs is to reverse the polarity of the undesirable reflections at one input with respect to the other input, thereby translating differential reflections into common mode reflections. However, a result of this open-short configuration is that the outputs of the coupler have mismatched dc characteristics.

Other documents of interest in the field of distributed high speed data include two co-pending U.S. Pat. Nos. 5,852,637 and 5,058,144: "Serial Multi-Gb/s Data Receiver" and "Multi-Gb/s Data Pulse Receiver", both by Anthony K. D. Brown and assigned to Northern Telecom Limited. These two documents present a serial multi-Gb/s data receiver, whose characteristics include wide frequency bandwidth, matched input impedance and, in particular, a method for automatic hysteresis adjustment for very small continuous data signals The second disclosure, "Multi-Gb/s Data Pulse Receiver", improves the original receiver as it was not suitable for working in conjunction with a coupler of the type disclosed by Williamson due to dc biasing problems caused by the mismatched dc characteristics of the coupler's outputs. The improved receiver is immune to any dc biasing problems that the coupler may present, as well as provides rejection of any common mode reflections that the coupler introduces.

Standard communications theory states that the input noise level relative to the hysteresis level must be of the order of −24 dB to obtain a transmission bit error rate of one error in $10^{-14}$. The need to adjust the hysteresis level of a receiver in order to obtain this bit error rate requires that the signal level of the data at the receiver be known. The signal level will vary due to variations at the data driver (power supply, process and temperature), as well as due to variations of the transmission medium and attenuation Consequently, it is necessary to continuously monitor the level of the signal at the receiver. The weakness of the multi Gb/s data pulse receiver is therefore that, while it offers automatic hysteresis adjustment for continuous data signals, it cannot support easily hysteresis adjustment for ATM style data.

Asynchronous Transfer Mode (ATM) is a connection-oriented packet switching technique, in which all packets are of fixed length (53 bytes). Generalizing, ATM style data does not necessarily ensure strict conformity with this definition, and may even consist in variable length packets. However, this style of data is bursty in nature, and must be transmitted at its peak rate of burst, with the possibility that the average arrival time between bursts may be quite large and randomly distributed. Due to the intermittent nature of the data, it is difficult to continuously monitor the data and the associated time constants are too long for immediate adjustment of the hysteresis control. Therefore, it is difficult to continuously compensate for signal strength and variation with time and distance.

The background information provided above shows that there exists a need in the industry to provide a data pulse receiver capable of compensating the distributed high speed data signal attenuation incurred over a transmission medium.

OBJECTIVES AND STATEMENT OF THE INVENTION

An object of the present invention is to provide a data pulse receiver capable of automatic hysteresis adjustment.

Another object of the invention is to provide a signal processing circuit capable of generating a hysteresis control signal for use in a data pulse receiver.

Yet, another object of the intention is to provide a novel method for performing hysteresis adjustment in a data pulse receiver.

As embodied and broadly described herein, the invention provides a data pulse receiver for receiving data signals propagating on a high speed data transmission medium including data and clock channels, said data pulse receiver including:
- a first input for coupling to a data channel of the transmission medium to receive data pulses;
- a second input for coupling to a clock channel of the transmission medium to receive a clock signal;
- a hysteresis generating means coupled to said second input for generating a hysteresis control signal at least in part on a basis of the clock signal;
- a data pulse detector coupled to said first input and to said hysteresis generating means for receiving the hysteresis control signal, for outputting amplified data pulses.

In a specific example, the data pulse detector is a flip-flop circuit including a pair of transistors. The hysteresis generating means includes a current source that causes a controlled amount of tail current to pass in the transistors and their associated load resistors. The magnitude of the tail current controls the data pulse detection level of the circuit. The hysteresis generating means controls this tail current on the basis of the clock signal to provide a continuous adjustment of the data pulse detection level.

As embodied and broadly described herein, the invention also provides a pulse detection circuit capable of generating a hysteresis control signal for use in a data pulse receiver, which receives data signals propagating on a high speed data transmission medium including data and clock channels, said data pulse detection circuit including:
- an input for coupling to a clock channel of the transmission medium to receive a clock signal;
- a hysteresis generating means coupled to said input for generating a hysteresis control signal at least in part on a basis of the clock signal, said hysteresis control signal being capable of adjusting a pulse detection level of a data pulse detector of the data pulse receiver.

As embodied and broadly described herein, the invention also provides a method for receiving data signals propagating on a high speed data transmission medium including data and clock channels, said method including:
- sensing fluctuations in a signal propagating on a data channel of the high speed data transmission medium, said fluctuations being potentially representative of data pulses;
- detecting a clock signal propagating on a clock channel of the high speed data transmission medium;
- processing the detected clock signal to generate a hysteresis control signal;
- utilizing said hysteresis control signal to determine which of the fluctuations sensed on said data channel are representative of data pulses.

DESCRIPTION OF A PREFERRED EMBODIMENT

Figure 1:
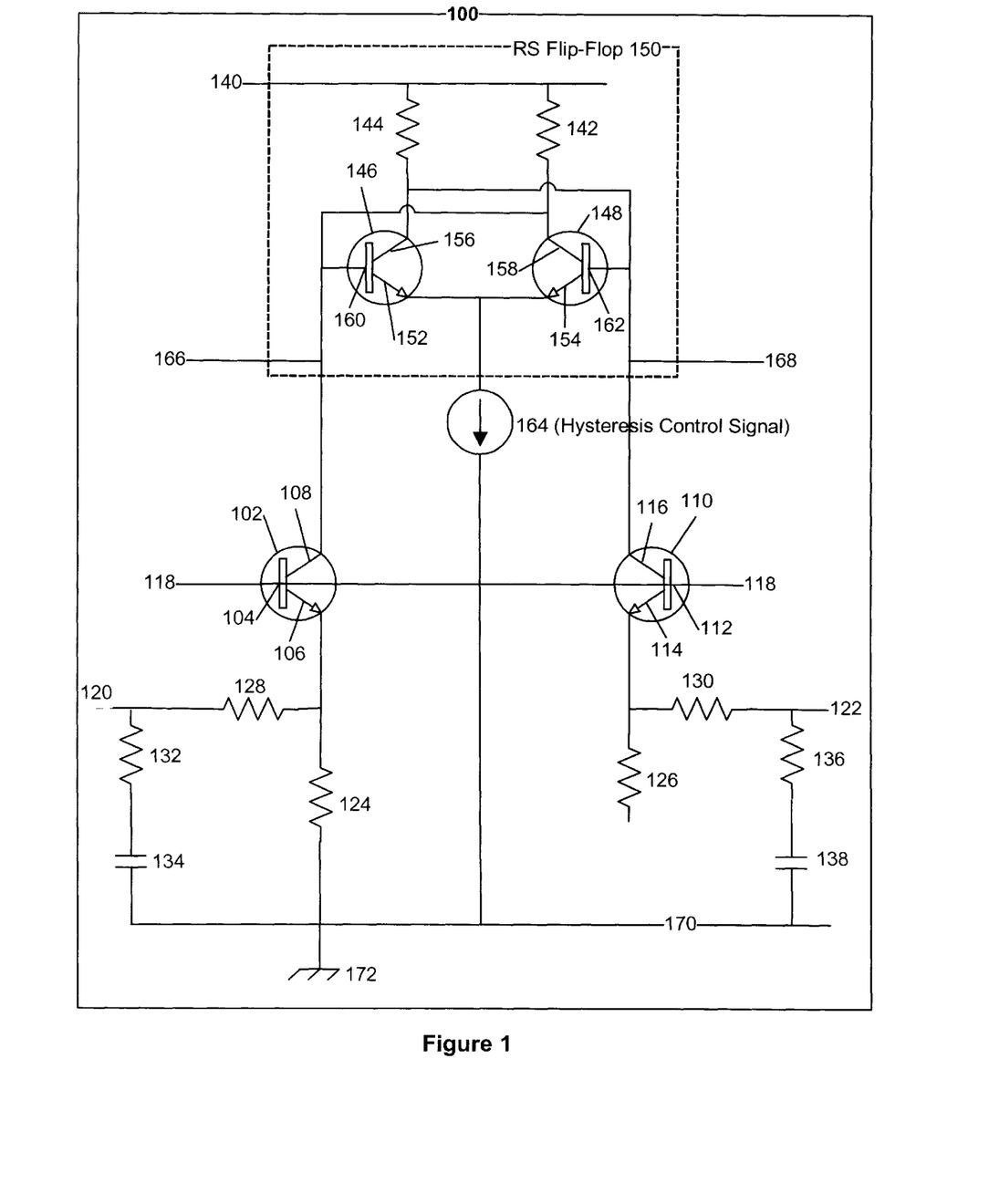
FIG. 1 is a circuit diagram of a data pulse detector circuit with input parallel dummy load, in accordance with the invention.

FIG. 1 is a circuit diagram of a preferred embodiment of a data pulse detector, component of a data receiver, in accordance with the present invention. A data pulse detector 100 includes a grounded base amplifier 102 having a base 104, an emitter 106 and a collector 108, and a grounded base amplifier 110 having a base 112, an emitter 114 and a collector 116. Bases 104 and 112 are connected to an ac ground 118 and are typically biased at 1.3 volts dc.

The data signal on which the data pulse detector 100 operates is impressed at inputs 120 and 122. Those inputs feature dummy loads including a resistor and a capacitor in series. They will be described in detail later. The amplified data pulses that have been detected appear at the outputs 166 and 168.

Figure 3:
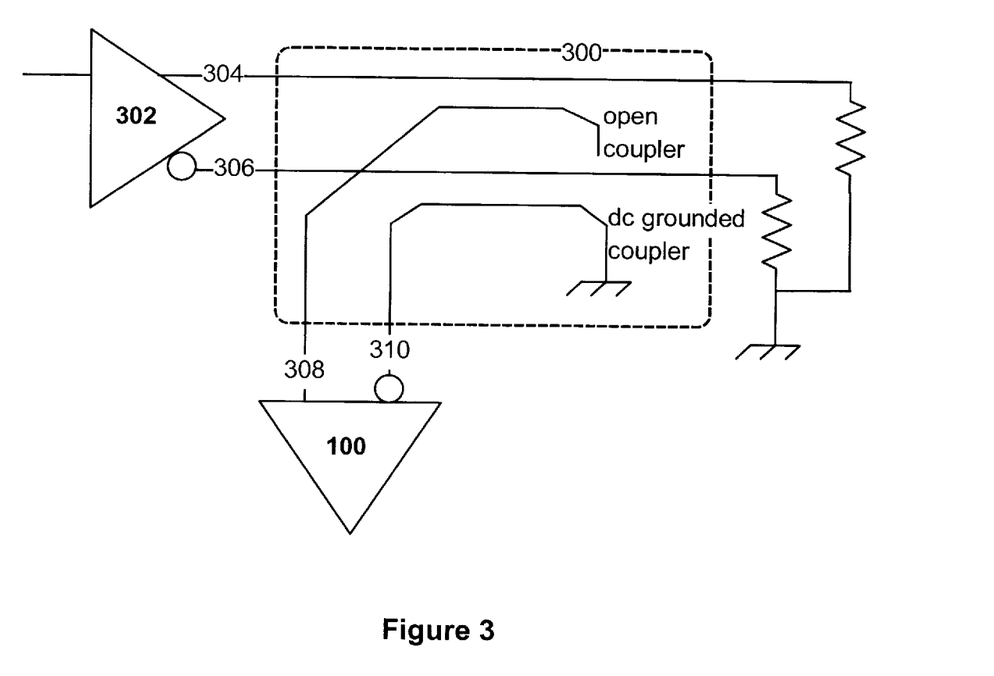
FIG. 3 is a circuit diagram of a Williamson coupler.

Typically, the data signal impressed at the inputs 120 and 122 can be obtained from a Williamson coupler of the type illustrated in FIG. 3. This coupler operates with a high speed transmission medium including data and clock channels. A differential data driver 302 transmits differential signals on transmission channels 304 and 306. The coupler 300 detects the differential signals and outputs differential data pulses on an open coupler output 308 and a dc grounded coupler output 310. Each signal that is to be detected on the high speed data transmission medium requires a separate Williamson coupler. With the data pulse receiver circuit of the present invention, at least two Williamson couplers are required, one to pick-up data signals and one to pick-up a clock signal.

Referring back to FIG. 1, the dc open input 120 is connected to the emitter 106 of the amplifier 102 through an impedance matching resistor 128. An impedance matching resistor 130 connects a dc grounded input 122 to the emitter 114 of the amplifier 110. Differential data pulses are supplied to inputs 120 and 122 from coupler outputs 308 and 310, respectively. A dc biasing resistor 124 is connected between the emitter 106 and an external ground 172. A matching resistor 126, connected at one terminal to the emitter 114 and unconnected at the other terminal, compensates for on-chip substrate noise picked up by the parasitic capacitance of the dc biasing resistor 124. In the case of minimal substrate noise, the resistor 126 may be omitted from the receiver circuit.

Collectors 108 and 116 are connected to a positive source 140 through load resistors 142 and 144 respectively. Load resistors 142 and 144 in combination with bipolar transistors 146 and 148 form a regenerating flip-flop 150. The regenerating flip-flop 150, that forms the core of the data pulse reconverts a Return-to-Zero (RZ) pulse signal to a Non-Return to Zero (ARZ) format output signal. Transistors 146 and 148 include commonly connected emitters 152 and 154, collectors 156 and 158, and bases 160 and 162. The commonly connected emitters 152 and 154 are provided with a tail current by a current source 164 that has a return path to an internal on-chip ground 170. The output signal in NRZ format is provided at complementary output terminals 166 and 168.

The tail current generated by the current source 164 is a hysteresis control signal that adjusts the pulse detection level of the flip-flop 150. This control signal is derived from the clock signal, as it will be described in greater detail later.

The impedance matching resistor 130 provides a DC current path to ground for the amplifier 110 when the input 122 is connected to the DC grounded coupler output 310. DC current flowing through this path provides biasing of the amplifier 110. A typical value of 100 ohms for the impedance matching resistor 130 results in a dc bias current in the order of 4 mA when the base 112 is connected to 1.3 volts dc.

The DC biasing resistor 124 provides a DC current path to the external ground 172 for the amplifier 102. A typical value of 100 ohms for the dc biasing resistor 124 results in a DC bias current in the order of 4 mA when the base 104 is connected to 1.3 volts DC The DC biasing resistor 124 does not cause significant imbalance to the AC characteristics of the grounded base amplifiers 102 and 110 because it is connected in parallel with the emitter impedance of the grounded base amplifier 102, which is in the order of 5 ohms. This impedance is dependent upon the DC biasing current of the grounded base amplifier 102.

Resistors 124 and 130 provide symmetrical DC biasing current for the grounded base amplifiers 102 and 110, respectively, when the asymmetrical coupler outputs 308 and 310 are connected to their respective inputs.

In order to reduce the effect of internal noise, which is present at the internal on-chip ground 170, the return path for the DC biasing current of amplifier 102 is provided by the external ground 172. Consequently, when the coupler output shorted to ground is connected to the external ground, noise at the external ground appears as common mode noise to the amplifiers and is therefore rejected by the receiver 100, which is substantially immune to the effect of common mode interfering reflections. The return path to the external ground 172 provides an important order of magnitude reduction in the amount of timing jitter of the NRZ output signal compared to a return path to internal on-chip ground 170.

The matching resistor 126 compensates for the substrate noise picked up by the parasitic capacitance of the DC biasing resistor 124. One terminal of the matching resistor 126 is connected to the emitter 114 and the other terminal is left unconnected. As a result, substrate noise that is coupled by the parasitic capacitance of resistors 124 and 126 appears as common mode noise and is therefore rejected. Alternatively, resistor 126 may be omitted from the receiver circuit in the case of minimal substrate noise, as mentioned above.

As mentioned earlier, the resistor 132 in series with the capacitor 134 form a dummy circuit which is connected between the DC open input 120 and the internal chip ground 170. Similarly, the resistor 136 in series with the capacitor 138 form a second dummy circuit which is connected between the DC grounded input 122 and the internal chip ground 170. Consequently, both dummy circuits are connected in parallel with the data pulse detector circuit. This characteristic will be addressed in greater detail later during the description of the circuit illustrated in FIG. 2.

The detector 100 has a large bandwidth due to the use of the grounded base amplifiers 102 and 110. The effect of parasitic capacitance on the input terminals 120 and 122, which would normally be to shunt the input signal, is compensated by an inductance seen at the emitters 106 and 114 of the grounded base amplifiers 102 and 110. This effect significantly extends the frequency response of the amplifiers 102 and 110.

The transistors of the grounded base amplifier will in general be quite large, in order to withstand electrostatic discharge potentials. This protection could be augmented by means of parallel diodes (not shown). As a result, due to the size of the transistors, the effect of parasitic emitter and base resistance has been neglected since these will be quite small. The design of the grounded base amplifier will not be described in further detail as it is well known to those who are skilled in the art and is not critical to the success of this invention.

As discussed previously, the grounded base amplifiers 102 and 110 are connected to a set-reset flip-flop 150. The magnitude of the tail current of the flip-flop 150 can be adjusted by current supply 164, forming the hysteresis control signal to obtain a controlled amount of hysteresis. In practice, the hysteresis control signal is adjusted to an amount specified for detection of a particular input signal current. This input current passes through the collector load resistors 142 and 144 of the flip-flop 150. At the same time, the hysteresis control signal of the flip-flop 150 passes through the same collector load resistors. Therefore, to change the state of the RS flip-flop 150, the voltage produced by the current pulses in the collector resistors 142 and 144 must exceed the voltage established by the hysteresis control signal of the flip-flop in the same resistors.

In theory, it is possible to adjust the hysteresis control signal by means of an external resistor or wired connection, to suit a particular application. If the input signal is differential, then the contribution of the input signal currents from both inputs 120 and 122 must be taken into account. However, if the input signal is only applied to one input of the receiver 100, the tail current must be halved for the same amount of hysteresis. In most circumstances the input signal will be differential so as to take advantage of the substantial immunity to common mode input noise of the receiver 100. It should also be noted that according to standard communications theory the input noise level relative to the hysteresis level must be of the order of −24 dB to obtain a transmission bit error rate of one error in $10^{-14}$.

In a particular application of a signal data receiver, the level of the input signal or data is either not known or is variable. Under these conditions a fixed hysteresis level is undesirable since an optimum bit error rate cannot generally be obtained. To overcome this difficulty, the prior art proposes techniques that rely on monitoring the level of the incoming data signal and to adjust the hysteresis level by automatic means.

A possible target specification for the receiver 100 is that it should be able to detect incoming data pulses having a peak amplitude of 30 mV and pulse duration exceeding the hysteresis level of not less than 200 ps. The energy present in such data pulses is so small that monitoring the level accurately presents some difficulty. In this regard, recall that the data pulses are converted immediately from RZ (return to zero) format to NPZ (non-return to zero) format by the detector 100. Direct monitoring of the amplitude of the input data stream has in fact been difficult to implement.

An alternative scheme exists which successfully monitors the input pulse height very accurately and enables optimum adjustment of the hysteresis level. The pulse height at the outputs 166 and 168 of the detector 100 is primarily determined by the level of the hysteresis bias current of the flip-flop 150. The flip-flop 150 will toggle, thereby changing the state of the outputs 166 and 168, provided the input data signal magnitude exceeds the hysteresis level by an unknown amount. If the outputs 166 and 168 are connected to a differential pair, then the output of the differential pair will also toggle, if the flip-flop 150 toggles. Further, common mode variations at the outputs 166 and 168 will not be present at the output of the differential pair. Thus the presence or absence of pulses at the output of the differential pair can be taken to indicate that the hysteresis level is either less than or greater than the differential magnitude of the incoming data pulse.

By AC coupling the output of the differential pair to a rectifier circuit, one obtains a signal whose magnitude is either large, or very small, depending on whether the hysteresis level is less than or greater than the incoming data pulse peak magnitude. In addition, by integrating the output of the rectifier circuit, a voltage is obtained which can be used to adjust the level of the hysteresis bias current. The net result is an automatic hysteresis adjustment which continuously adjusts the detector 100 hysteresis level to the level of the data pulses.

A problem with this approach, however, is that the adjustment of the hysteresis level to the peak magnitude of the data pulses will result in unreliable reception of the data. It will be unreliable because even a slight reduction in the magnitude of a data pulse could result in it not being detected. Utilizing a second data pulse detector in parallel with the first provides a solution to this problem. The first detector monitors the data pulse magnitude while the second detector has its hysteresis level set to a value proportionally lower than that of the first receiver In fact, it is possible to set the hysteresis level of the second detector to be any desired proportion of the peak height of the data pulse. A level of 50% usually could provide an optimum bit error rate performance.

Specific to the preferred embodiment of this invention, the direct application of this prior art hysteresis control may result in possible functional errors due to the burst mode nature of the transmitted data. Under circumstances where the actual presence of data is sporadic and not known at any particular instant in time, the present invention, taking advantage of a feature of the backplane system architecture which requires that a clock of the same bit rate as the data should be transmitted simultaneously with the data signal, relies on the clock signal, rather than the data signal to allow the hysteresis level to be adequately controlled.

In a typical high speed data transmission medium featuring the backplane architecture, four differential data signal channels carry four bits of data in a four bit data bus from a data transmitter to the multi-point data receivers. A fifth bit comprising a synchronized clock differential signal channel accompanies the four-bit data bus and is physically located in the middle of the four-bit data bus, thus creating a symmetrical five-bit clock and data bus. This configuration is adopted to minimize the timing skew between the clock differential connection and any one of the four data differential connections. By means of existing backplane physical layout techniques, the clock and data channel characteristics can be accurately matched, the result being that the clock and data signals in a single 5-bit bus arrive at the data receiver with substantially the same amplitude. A feature of the asynchronous transmission system is that while the data is operated in burst mode, it is maintained in bit-synchronism with the accompanying clock and the transmission of the clock is continuous.

The data pulse receiver in accordance with the present invention features a novel shared hysteresis control signal which allows a suitable hysteresis level for the data signals to be obtained, less subject to variations as a result of the burst mode data characteristics.

Figure 2:
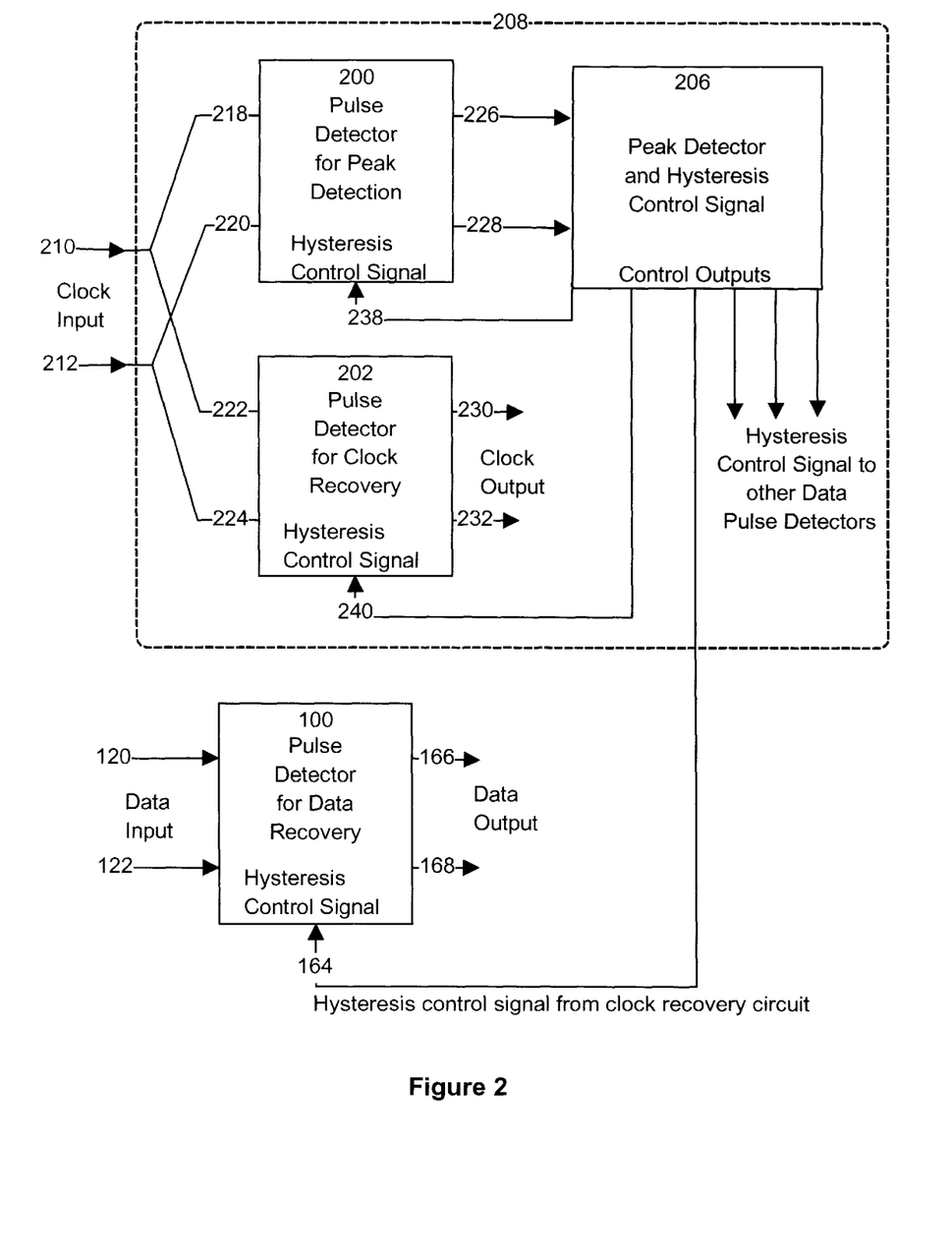
FIG. 2 is a system level diagram of a data pulse receiver circuit, including a shared hysteresis control signal derived from a clock signal, in accordance with this invention.

FIG. 2 is a system level block diagram of a data pulse receiver, including a shared hysteresis control signal, in accordance with the invention. Generally, speaking, the data pulse receiver includes two main functional blocks, namely a hysteresis control signal generator and one or more data pulse detectors (of the type described in connection with FIG. 1) that implement a detection threshold in dependence of the hysteresis control signal value. The hysteresis control signal generator is identified by the reference numeral 208 and includes a pulse detector 200 for peak detection, which receives the clock signal as input. The clock signal is actually received by two parallel pulse detectors, 200 and 202. The pulse detector 200 output drives a peak detector 206 which controls, in a feedback fashion, the hysteresis level of both pulse detectors 200 and 202, where pulse detector 202 is actually responsible for the recovery of the clock signal. As a result the hysteresis level of the pulse detector 200 is adjusted to adequately monitor the peak amplitude of the clock signal. The same peak detector 206 has other outputs which are set to drive other pulse detectors, at a lower, specified hysteresis level. For example, the ratio of these other hysteresis levels to the first hysteresis level could be typically 50%, so that the other pulse detectors slice the data eye at mid point. These latter pulse detectors are used as follows: one is the second clock pulse detector 202 which recovers the clock signal, while the others are the pulse detectors 100 which are slaved to the clock recovery circuit in that they receive data signals with the same hysteresis level as the clock recovery circuit. Consequently, the hysteresis level of the data pulse detectors can be set at 50% of the peak data signal on a continuous basis, even though the data is bursty in nature.

Figure 4:
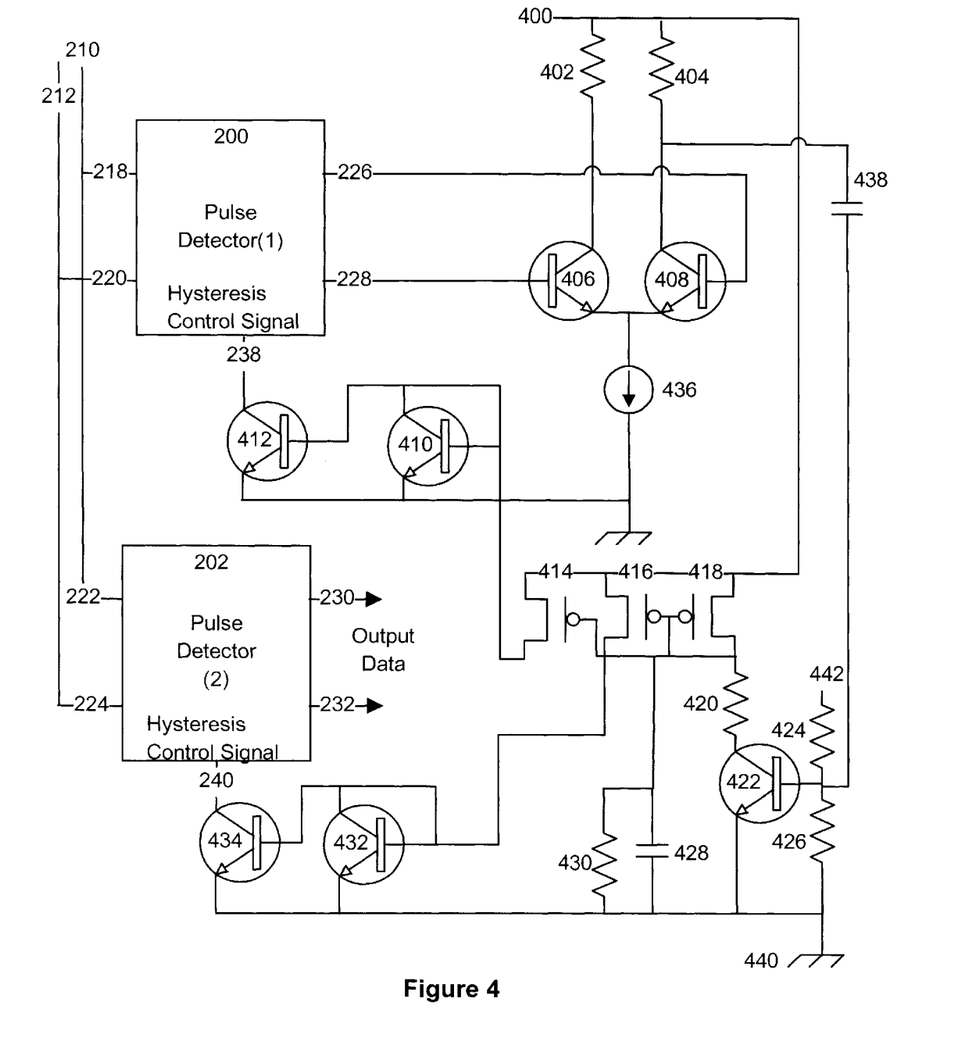
FIG. 4 is a circuit diagram of a circuit for generating a hysteresis control signal.

The circuit diagram of the hysteresis control signal generator 208 that also includes the clock recovery circuit is shown in greater detail in FIG. 4, and is specifically a data pulse receiver including automatic hysteresis adjustment. Since the clock amplitude at the source is specified to be identical to that of the data, and since the data rate is the same, the transmission qualities are identical for clock and data. As a result, the clock being more or less continuous in nature can be monitored at the data receiver and the level of the data inferred from that of the clock. This is then used to adjust the hysteresis level for the data lines associated with the clock.

Figure 5:
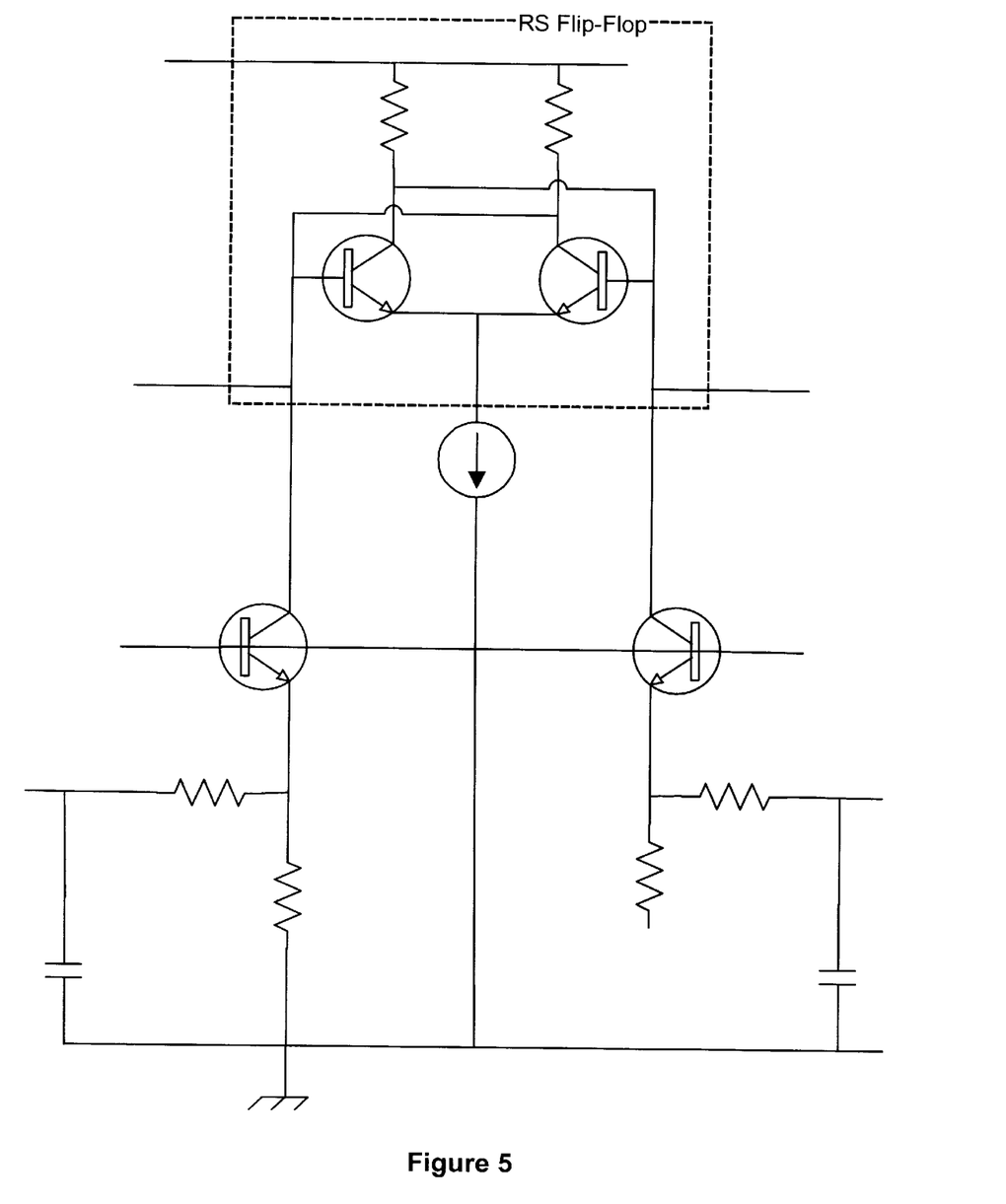
FIG. 5 is a circuit diagram of a serial multi Gb/s data pulse detector of the type shown in FIG. 4.

The pulse detectors 200 and 202 that form part of the hysteresis control signal generator 208 are identical. A schematical diagram of the pulse detector 200 is shown in FIG. 5. The diagram of the pulse detector 202 is identical to the diagram of the pulse detection stage 200 and for that reason it will not be described in detail. These serial multi-Gb/s pulse detectors are identical to the pulse detector 100 shown in FIG. 1, with the exception that they do not include the dummy RC circuits that are replaced by simple capacitors. Otherwise, all the functionality is the same as described above for the circuit diagram of FIG. 1.

Returning to FIG. 4, it is assumed that transistors 406, 408, 410, 412, 432 and 434 are all the same size. The P-channel field effect transistors (FETs) 414, 416 and 418 have different sizes: in particular the ratio of the transconductance of transistors 414 and 416 determines the ratio of the current sink from the detectors 200 and 202 respectively. The transistor pairs 410, 412 and 432, 434 are 1:1 mirrors used for mirroring the current sourced by transistors 414 and 416 respectively. If the transconductance of the transistor 418 is less than that of the transistor 416 then the P-channel FET mirror of the transistors 418, 416 will exhibit current gain This current gain increases the accuracy of pulse height detection which is an advantage. In a particular embodiment of the invention the transistors 418, 416 and 414 have equal channel lengths and their channel widths are in the ratio 1:5:10 respectively. In this arrangement the hysteresis level of the detector 202 will be set to half of the data peak amplitude.

The differential output of the pulse detector 200 is supplied to a differential pair of transistors 406 and 408. These transistors will switch if the output of the pulse detector 200 switches. This will occur if the clock pulse peak magnitude is greater than the hysteresis level of the pulse detector 200. An output of the differential pair of transistors 406, 408 is taken from the load resistor 404 and is AC coupled via a capacitor 438 to a detection unit comprising two resistors 424 and 426 and a transistor 422. In a practical circuit, one might utilize the output from the load resistor 402 with an additional parallel connected detection unit, thereby increasing the sensitivity of the detection unit. The second detection unit is not shown in FIG. 4 for the sake of simplicity.

The detection unit comprising the resistors 424 and 426 and the transistor 422 is biased by means of a reference voltage 442. The ratio of the resistors 424 and 426 is selected so that the voltage at the base of transistor 422 is just less than a diode voltage drop, say about 0.75 volts. When pulses are coupled via the capacitor 438 to the base of the transistor 422, they momentarily increase the potential on the base and thereby cause the transistor 422 to conduct current which causes a reduction in the gate potential of the FET 418. The capacitor 428 in conjunction with the resistor 420 is used to integrate the pulsed current from the transistor 422, so that the transistors 418, 416 and 414 conduct a slowly varying current The minimum value of the current in these transistors is set by the resistor 430, thereby establishing a minimum level of hysteresis, This is useful in the case of the absence of input data because it helps to prevent "chattering" of the output due to noise pulses.

In order for the hysteresis level derived from the clock signal to be correctly applied to the data pulse detectors, it is preferred that all five clock and data pulse detectors are identical. As seen in FIG. 2, the hysteresis control signal generator 208 comprises two parallel pulse detectors, one for the peak detection and one for the clock recovery. The data pulse detectors do not require their own peak detection circuits as this detection is being performed strictly on the continuous clock input signal. To avoid impedance imbalances, the serial data pulse detectors are provided with dummy RC circuits, as mentioned above and shown in FIG. 1. The primary function of the dummy circuits is to ensure that the input impedance of the data and clock pulse detectors as presented to the external bus are all identical and, ideally, 50 ohms each. A suitable dummy circuit as shown in FIG. 1 assures that the full variability of the signal strength over the backplane can be compensated continuously for burst mode data transmission.

The above description of a preferred embodiment under the present invention should not be read in a limitative manner as refinements and variations are possible without departing from the spirit of the invention. The scope of the invention is defined in the appended claims and their equivalents.

I claim:

1. A data pulse receiver for receiving data signals propagating on a high speed data transmission medium including data and clock channels, said data pulse receiver including:

a first input for coupling to a data channel of the transmission medium to receive data pulses;

a second input for coupling to a clock channel of the transmission medium to receive a clock signal;

a hysteresis generating unit coupled to said second input for generating a hysteresis control signal at least in part on a basis of the clock signal;

a data pulse detector coupled to said first input and to said hysteresis generating unit for receiving the hysteresis control signal, for outputting amplified data pulses.

2. A data pulse receiver as defined in claim 1, wherein said hysteresis generating unit includes a clock pulse detector coupled to said second input for receiving said clock signal.

3. A data pulse receiver as defined in claim 2, wherein said clock pulse detector includes an output for generating amplified clock pulses.

4. A data pulse receiver as defined in claim 3, wherein said hysteresis generating unit includes a hysteresis control signal generation stage including an input coupled to the output of said clock pulse detector, said hysteresis control signal generation stage including an output for producing in dependence of the amplified clock pulses said hysteresis control signal.

5. A data pulse receiver as defined in claim 4, wherein said clock pulse detector includes an input for receiving a hysteresis control signal coupled to the output of said hysteresis control signal generation stage.

6. A data pulse receiver as defined in claim 4, wherein said hysteresis control signal generation stage includes a plurality of outputs for producing a plurality of hysteresis control signals.

7. A data pulse receiver as defined in claim 6, wherein said plurality of hysteresis control signals have different physical characteristics to effect different levels of hysteresis control.

8. A data pulse receiver as defined in claim 7, wherein said receiver includes a pulse detector other than said clock pulse detector for receiving the clock signal and outputting a regenerated and amplified clock signal.

9. A data pulse receiver as defined in claim 8, wherein said pulse detector other than said clock pulse detector includes an input for receiving one of said plurality of hysteresis control signals.

10. A data pulse receiver as defined in claim 1, wherein said data pulse detector includes a flip-flop circuit.

11. A data pulse receiver as defined in claim 10, wherein said flip-flop circuit includes a pair of transistors.

12. A data pulse receiver as defined in claim 10, wherein said hysteresis control signal is applied to said flip-flop circuit.

13. A data pulse receiver as defined in claim 11, wherein said hysteresis control signal is a current signal passing through said transistors.

14. A data pulse receiver as defined in claim 1, wherein said first input includes a first signal reception point and a second signal reception point, said signal reception point receiving a differential signal conveying the data pulses.

15. A data pulse receiver as defined in claim 14, wherein said first signal reception point is capable of being connected to a data coupler having a DC path to ground.

16. A data pulse receiver as defined in claim 15, wherein said second signal reception point is capable of being connected to a data coupler having no DC path to ground.

17. A pulse detection circuit capable of generating a hysteresis control signal for use by a data pulse receiver receiving data signals propagating on a high speed data transmission medium including data and clock channels, said pulse detection circuit including:

an input for coupling to a clock channel of the transmission medium to receive a clock signal;

a hysteresis generating unit coupled to said input for generating a hysteresis control signal at least in part on a basis of the clock signal, said hysteresis control signal being capable of adjusting a pulse detection level of a data pulse detector of the data pulse receiver.

18. A method for receiving data signals propagating on a high speed data transmission medium including data and clock channels, said method including:
   sensing fluctuations in a signal propagating on a data channel of the high speed data transmission medium, said fluctuations being potentially representative of data pulses;
   detecting a clock signal propagating on a clock channel of the high speed data transmission medium;
   processing the detected clock signal to generate a hysteresis control signal;
   utilizing said hysteresis control signal to determine which of the fluctuations sensed on said data channel are representative of data pulses.

19. A pulse detection circuit as defined in claim 17, wherein said hysteresis generating unit includes a clock pulse detector coupled to said input for receiving said clock signal.

20. A pulse detection circuit as defined in claim 19, wherein said clock pulse detector includes an output for generating amplified clock pulses.

21. A pulse detection circuit as defined in claim 20, wherein said hysteresis generating unit includes a hysteresis control signal generation stage including an input coupled to the output of said clock pulse detector, said hysteresis control signal generation stage including an output for producing in dependence of the amplified clock pulses said hysteresis control signal.

22. A pulse detection circuit as defined in claim 21, wherein said clock pulse detector includes an input for receiving a hysteresis control signal coupled to the output of said hysteresis control signal generation stage.

23. A pulse detection circuit as defined in claim 22, wherein said hysteresis control signal generation stage includes a plurality of outputs for producing a plurality of hysteresis control signals.

24. A pulse detection circuit as defined in claim 23, wherein said plurality of hysteresis control signals have different physical characteristics to effect different levels of hysteresis control.

25. A data pulse receiver for receiving data signals propagating on a high speed data transmission medium including data and clock channels, said data pulse receiver including:
   first input means for coupling to a data channel of the transmission medium to receive data pulses;
   second input means for coupling to a clock channel of the transmission medium to receive a clock signal;
   hysteresis generating means coupled to said second input means for generating a hysteresis control signal at least in part on a basis of the clock signal;
   data pulse detection means coupled to said first input means and to said hysteresis generating means for receiving the hysteresis control signal, for outputting amplified data pulses.

26. A pulse detection circuit capable of generating a hysteresis control signal for use by a data pulse receiver receiving data signals propagating on a high speed data transmission medium including data and clock channels, said pulse detection circuit including:
   input means for coupling to a clock channel of the transmission medium to receive a clock signal;
   hysteresis generating means coupled to said input means for generating a hysteresis control signal at least in part on a basis of the clock signal, said hysteresis control signal being capable of adjusting a pulse detection level of a data pulse detector of the data pulse receiver.

* * * * *